United States Patent
Kawamura et al.

(10) Patent No.: US 9,364,786 B2
(45) Date of Patent: Jun. 14, 2016

(54) EXHAUST GAS ABATEMENT APPARATUS

(71) Applicant: EBARA CORPORATION, Toyko (JP)

(72) Inventors: Kohtaro Kawamura, Tokyo (JP); Toyoji Shinohara, Tokyo (JP); Tetsuro Sugiura, Tokyo (JP); Hideo Arai, Tokyo (JP); Takashi Kyotani, Tokyo (JP); Toshiharu Nakazawa, Tokyo (JP); Keiichi Ishikawa, Tokyo (JP); Seiji Kashiwagi, Tokyo (JP); Yasuhiko Suzuki, Tokyo (JP)

(73) Assignee: Ebara Corporation, Tokyo (JP)

( * ) Notice: Subject to any disclaimer, the term of this patent is extended or adjusted under 35 U.S.C. 154(b) by 63 days.

(21) Appl. No.: 14/226,741

(22) Filed: Mar. 26, 2014

(65) Prior Publication Data
US 2014/0290919 A1    Oct. 2, 2014

(30) Foreign Application Priority Data

Mar. 28, 2013    (JP) .................................. 2013-069730

(51) Int. Cl.
*B01D 53/34*    (2006.01)
*C23C 16/44*    (2006.01)
*F23G 7/06*    (2006.01)
*F04B 37/06*    (2006.01)
*F04B 37/14*    (2006.01)

(52) U.S. Cl.
CPC .......... *B01D 53/343* (2013.01); *C23C 16/4412* (2013.01); *F04B 37/06* (2013.01); *F04B 37/14* (2013.01); *F23G 7/065* (2013.01); *Y02C 20/30* (2013.01)

(58) Field of Classification Search
CPC ............... B01D 53/343; B01D 53/005; B01D 2258/0216; F23G 7/065; F04B 37/06; F04B 37/14; C23C 16/4412; Y02C 20/30
USPC .......................................... 422/168, 173, 182
See application file for complete search history.

(56) References Cited

U.S. PATENT DOCUMENTS

| 5,183,646 A * | 2/1993 | Anderson ............... B01D 53/34 422/173 |
| 5,301,701 A | 4/1994 | Nafziger |
| 5,769,626 A * | 6/1998 | Hauff ..................... B01D 53/00 417/201 |
| 2008/0206445 A1 | 8/2008 | Peck et al. |

FOREIGN PATENT DOCUMENTS

| JP | 09-000861 | 1/1997 |
| JP | 2004-200364 | * 7/2004 |
| JP | 2011-163150 A | 8/2011 |

OTHER PUBLICATIONS

Machine translation of JP 2004-200364 (Jul. 2004).*
European Patent Application No. 14020041.1; Extended European Search Report; dated Oct. 31, 2014; 5 pages.

* cited by examiner

*Primary Examiner* — Jill Warden
*Assistant Examiner* — Joye L Woodard
(74) *Attorney, Agent, or Firm* — Baker & Hostetler LLP (57) ABSTRACT

A vacuum pump has a discharge port coupled to an abatement chamber for treating an exhaust gas discharged from a chamber of a manufacturing apparatus to make the exhaust gas harmless. The vacuum pump is coupled to a heat exchanger configured to heat an inert gas by using heat generated when the exhaust gas is treated to be made harmless in the abatement part. The inert gas heated by the heat exchanger is introduced into the vacuum pump.

7 Claims, 8 Drawing Sheets

EXHAUST GAS ABATEMENT APPARATUS

CROSS REFERENCE TO RELATED APPLICATION

This application claims priority to Japanese Patent Application No. 2013-069730 filed Mar. 28, 2013, the entire contents of which are hereby incorporated by reference.

BACKGROUND

In a manufacturing process for manufacturing semiconductor devices, liquid crystal panels, LEDs, solar cells or the like, a process gas is introduced into a process chamber which is being evacuated to perform various processes such as an etching process, a CVD process or the like. The process chamber for performing several processes such as an etching process, a CVD process or the like is evacuated by a vacuum pump. Further, the process chamber and exhaust apparatuses connected to the process chamber are cleaned periodically by supplying a cleaning gas thereto. Because exhaust gases such as the process gas, the cleaning gas or the like contain a silane-based gas ($SiH_4$, TEOS or the like), a halogen-based gas ($NF_3$, $ClF_3$, $SF_6$, $CHF_3$ or the like), a PFC gas ($CF_4$, $C_2F_6$ or the like) or the like, such exhaust gases have negative effects on the human member and on the global environment such as global warming. Therefore, it is not preferable that these exhaust gases are emitted to the atmosphere as they are. Accordingly, these exhaust gases are made harmless by an exhaust gas treatment apparatus provided at a downstream side of the vacuum pump, and the harmless exhaust gases are emitted to the atmosphere.

Heretofore, the vacuum pump and the exhaust gas treatment apparatus are housed respectively in individual housings, and hence they are installed in distant positions and are required to be connected to each other by a connecting pipe. Thus, the vacuum pump and the exhaust gas treatment apparatus have not been an optimum system from the standpoint of saving energy by interchanging necessary heat between the vacuum pump and the exhaust gas treatment apparatus. Therefore, a system comprising a vacuum pump and an exhaust gas treatment apparatus which are accommodated in one housing and connected by a short pipe has been developed, and such system has been sold as an integrated-type exhaust system. However, even in such integrated-type exhaust system, the pipe interconnecting the vacuum pump and the exhaust gas treatment apparatus is several meters long, and is kept warm or heated by a heater or the like for preventing a product generated by gas treatment from being attached to the pipe.

In both of the exhaust system wherein the vacuum pump and the exhaust gas treatment apparatus are housed respectively in individual housings and the exhaust system wherein the vacuum pump and the exhaust gas treatment apparatus are housed in one housing, it is problematic that the heat of the exhaust gas heated by compression beat of the vacuum pump has not been effectively utilized in the exhaust gas treatment apparatus provided at the subsequent stage of the vacuum pump.

Further, in the above exhaust systems, in order to prevent a product from being attached to the interior of the vacuum pump, in some cases, purging by a heated inert gas is performed for the purpose of lowering partial pressure of the product. However, if the inert gas is used without being heated, vapor pressure is also lowered, and thus the product cannot be prevented from being attached to the interior of the vacuum pump. Therefore, it is indispensable to heat the inert gas. In this case, a dedicated heater is necessary for heating the inert gas, and the generated heat is transferred primarily to the surrounding part and the treated gas and is not reused.

SUMMARY OF THE INVENTION

The present invention relates to a vacuum pump for use in an exhaust system of a manufacturing apparatus for manufacturing semiconductor devices, liquid crystal panels, LEDs, or the like, and more particularly to a vacuum pump with abatement function which comprises a vacuum pump, for evacuating a chamber of the manufacturing apparatus, to which an abatement function for treating an exhaust gas discharged from the chamber to make the exhaust gas harmless is added.

The present invention has been made in view of the above drawbacks. It is therefore an object of the present invention to provide a vacuum pump with abatement function which can utilize the heat of an exhaust gas heated by compression heat of a vacuum pump for abatement treatment of the exhaust gas to make the exhaust gas harmless, and can utilize the heat generated by the abatement treatment in an abatement part for heating an inert gas supplied to the vacuum pump.

In order to achieve the above object, according to one aspect of the present invention, there is provided a vacuum pump with abatement function, comprising: a vacuum pump having a discharge port to which an abatement part for treating an exhaust gas discharged from the vacuum pump to make the exhaust gas harmless is attached; and a heat exchanger configured to heat an inert gas by using heat generated when the exhaust gas is treated to be made harmless in the abatement part: wherein the inert gas heated by the heat exchanger is introduced into the vacuum pump.

According to the present invention, the exhaust gas discharged from the vacuum pump has been heated by compression heat in the vacuum pump to a temperature of about 200° C., and the heated exhaust gas is introduced from the discharge pipe directly into the abatement part wherein the exhaust gas is treated to be made harmless. Therefore, it is not necessary to warm the exhaust gas from normal temperature, and an amount of fuel used in the abatement part can be reduced, thus achieving energy saving.

Further, waste heat generated by abatement treatment of the exhaust gas is utilized to heat the inert gas such as an $N_2$ in the abatement part, and the heated inert gas is supplied to the vacuum pump. Therefore, purging of the vacuum pump can be performed by the heated inert gas, and thus a product can be prevented from being attached to the interior of vacuum pump. According to the present invention, it is not necessary to install a dedicated heater for heating the inert gas, thus achieving energy saving.

According to the present invention, a pipe for connecting the discharge port of the vacuum pump and the abatement part has a piping length of 100 mm to 500 mm.

According to the present invention, since the discharge pipe which connects vacuum pump and the abatement part has a piping length of not more than 500 mm, and hence the product can be prevented from being attached to the discharge pipe.

According to a preferred aspect of the invention., the heat exchanger comprises a heat exchanger provided around or inside a gas treatment portion of the abatement part.

According to the present invention, by providing a heat exchanger outside or inside a combustion-type or electrothermal-type abatement part, the inert gas can be heated by using the heat generated by the abatement treatment of the exhaust gas.

According to a preferred aspect of the invention, the heat exchanger comprises a heat exchange part which is divided into a plurality of stages, and the number of stages of the plural-stage heat exchange part is switched to control a temperature of the heated inert gas.

According to a preferred aspect of the invention, a heat insulating material is provided between a gas treatment portion of the abatement part and the heat exchanger.

According to the present invention, by providing the heat insulating material, components of the heat exchanger (for example, seal materials) are not heated more than necessary, and thus the components are not damaged. The inner wall of the abatement part may comprise a wall containing a heat insulating material.

According to a preferred aspect of the invention, a heater for further heating the inert gas heated by the heat exchanger is provided, and the inert gas heated by the heater is introduced into the vacuum pump.

According to the present invention, the inert gas heated by the heat exchanger which utilizes waste heat of the abatement part is further heated by the heater. Thus, the temperature of the inert gas can be equal to the internal temperature of the vacuum pump, and a change in dimension of the rotor and the casing can be minimized.

According to a preferred aspect of the present invention, a pipe for introducing the inert gas from the heat exchanger to the vacuum pump comprises a double pipe, and an inner pipe of the double pipe serves as a passage for the inert gas and a space between the inner pipe and an outer pipe is evacuated by the vacuum pump.

According to the present invention, by evacuating an outer side of the pipe for introducing the inert gas from the heat exchanger to the vacuum pump, the inert gas can be kept warm.

According to a preferred aspect of the present invention, a pipe for connecting the discharge port of the vacuum pump and the abatement part comprises a double pipe, and an inner pipe of the double pipe serves as a passage for the exhaust gas and a space between the inner pipe and an outer pipe serves as a passage for the inert gas heated by the heat exchanger to introduce the inert gas into the vacuum pump.

According to a preferred aspect of the present invention, a pipe for connecting the discharge port of the vacuum pump and the abatement part comprises a triple pipe, and an innermost pipe of the triple pipe serves as a passage for the exhaust gas, an outer space around the innermost pipe serves as a passage for the inert gas heated by the heat exchanger to introduce the inert gas to the vacuum pump, and an outermost space between the pipes is evacuated by the vacuum pump.

According to the invention, the outermost space of the triple pipe serves as a vacuum jacket, and this vacuum jacket is evacuated to perform vacuum insulation. Therefore, the inert gas and the exhaust gas which flow inside the vacuum insulation can be kept warm.

According to a preferred aspect of the present invention, the abatement part comprises a combustion-type abatement part configured to treat the exhaust gas by combustion or a heating-decomposition-type abatement part configured to treat the exhaust gas by heating and decomposition; a second heat exchanger configured to heat air by using heat generated when the exhaust gas is treated to he made harmless in the abatement part is provided; and the air heated by the second heat exchanger is introduced as preheated air into the abatement part.

In the combustion-type abatement part, in some cases, it is necessary to preheat air for oxidization to obtain pyrolysis temperature required in the abatement part. According to the invention, by heating the air for oxidization using waste heat of the abatement part, a heater required for preheating can be eliminated, thus promoting energy saving.

According to another aspect of the invention, there is provided a vacuum pump apparatus comprising; a plurality of vacuum pumps with abatement function according to claim 1; and a switching mechanism configured to distribute the inert gas heated by one of the plural abatement parts to any of the plurality of vacuum pumps, According to the invention, purging routes of the inert gas can be switched depending on operational situation of the process. For example, in the case where an increase of internal temperature of the vacuum pump is required to allow the vacuum pump immediately after its start to become operational, the heated inert gas discharged from the pair of the vacuum pump and the abatement part which have been already operated is supplied to another vacuum pump immediately after the start. Thus, the internal temperature of the vacuum pump immediately after the start can be increased.

The present invention offers the following advantages;

(1) The exhaust gas discharged from the vacuum pump has been heated by compression heat in the vacuum pump to a temperature of about 200° C., and the heated exhaust gas is introduced from the discharge pipe directly into the abatement part wherein the exhaust gas is treat ed to be made harmless. Therefore, it is not necessary to warm the exhaust gas from normal temperature, and an amount of fuel used in the abatement part can be reduced, thus achieving energy saving. Since the exhaust gas heated to a temperature of about 200° C. flows through the discharge pipe of the vacuum pump, it is not necessary to heat the discharge pipe by a heater for piping. Therefore, it is not necessary to install the heater for piping, and thus energy saving can be achieved.

(2) The waste heat generated by abatement treatment of the exhaust gas is utilized to heat the inert gas such as an $N_2$ in the abatement park and the heated inert gas is supplied to the vacuum pump. Therefore, purging of the vacuum pump can be performed by the heated inert gas, and thus a product can be prevented from being attached to the interior of vacuum pump. According to the present invention, it is not necessary to install a dedicated heater for heating the inert gas, thus achieving energy saving.

(3) In the case where a combustion-type abatement part or a heating-decomposition-type abatement part is employed as the abatement part, in some cases, it is necessary to preheat air for oxidization to obtain pyrolysis temperature required in the abatement part. By heating the air for oxidization using waste heat of the abatement part, a beat source such as a heater required for preheating or addition of fuel corresponding to preheating-amount can be eliminated, thus promoting energy saving.

(4) During operation of the process apparatus, when the vacuum pump is suddenly stopped due to its breakdown or the like, a countercurrent or backfire from the abatement part to the process apparatus via the vacuum pump occurs occasionally. Therefore, according to the present invention, if there is a possibility of sudden stop of the vacuum pump, a valve for supplying the inert gas is opened in conjunction with the detection of stop of the vacuum pump to perform the inert gas purging of the abatement part and the vacuum pump. Accordingly, the countercurrent between the abatement part and the vacuum pump can be prevented directly from occurring, thus preventing the countercurrent and the backfire to the process apparatus from occurring.

(5) The discharge pipe which connects the vacuum pump and the abatement part comprises a double pipe, and an inner pipe of the double pipe serves as a pipe for the exhaust gas between the vacuum pump and the abatement part and an interior of an outer pipe serves as a vacuum jacket. Then, the outer pipe is connected to the inlet of the vacuum pump to evacuate the vacuum jacket around the inner pipe, thereby performing vacuum insulation. Therefore, the discharge pipe can be kept warm.

DETAILED DESCRIPTION OF EMBODIMENTS

A vacuum pump with abatement function according to embodiments of the present invention will be described below with reference to FIGS. 1A through 10. In FIGS. 1A through 10, identical or corresponding parts are denoted by identical or corresponding reference numerals throughout views, and will not be described in duplication.

Figure 1A:
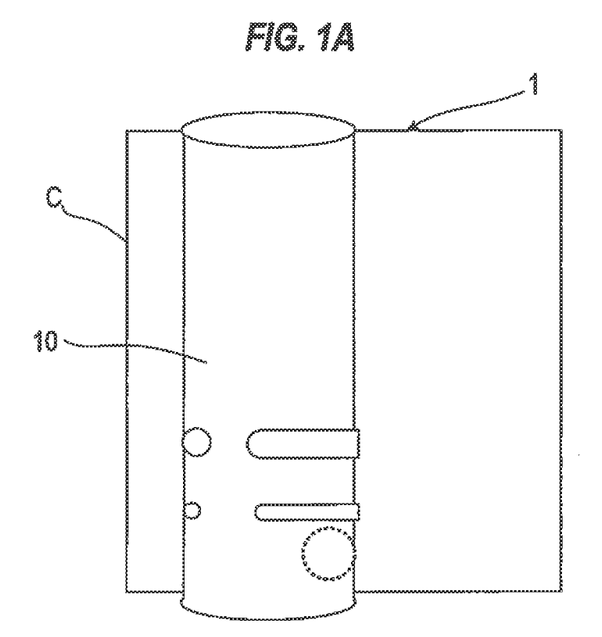
FIG. 1A is a schematic front elevational view showing a configuration example of a vacuum pump with abatement function according to an embodiment of the present invention.
Figure 1B:
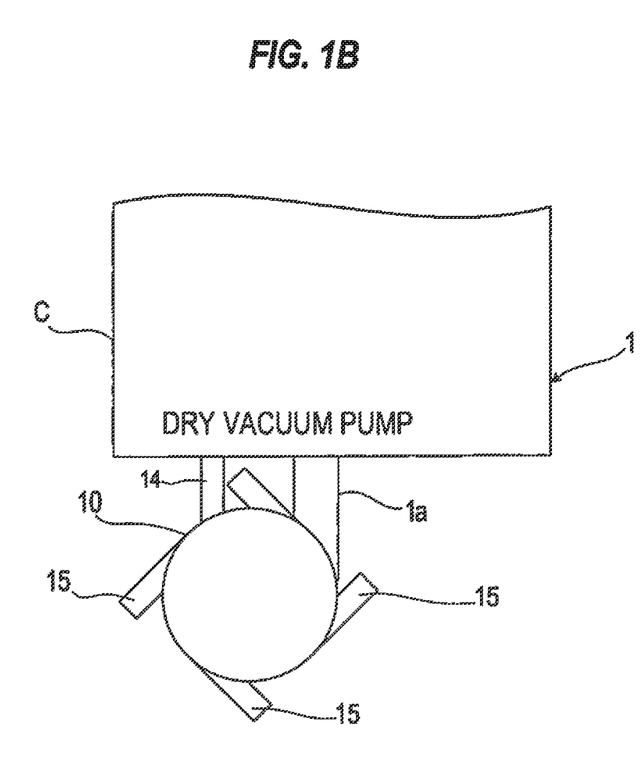
FIG. 1B is a schematic plan view of the vacuum pump shown in FIG. 1A.

FIGS. 1A and 1B are views showing a configuration example of a vacuum pump with abatement function according to the present invention. FIG. 1A is a schematic front view of the vacuum pump with abatement function, and FIG. 1B is a schematic plan view of the vacuum pump with abatement function.

As shown in FIGS. 1A and 1B, a vacuum pump with abatement function according to the present invention has a configuration wherein an abatement part 10 is attached to a discharge pipe 1a of a vacuum pump 1. The vacuum pump 1 may comprise a single dry vacuum pump or two dry vacuum pumps connected in series. The single dry vacuum pump or the two dry vacuum pumps comprise a roots-type dry vacuum pump, a screw-type dry vacuum pump, or the like which is well known in the art and will not be shown and described in detail below. In FIGS. 1A and 1B, the vacuum pump 1 is illustrated as a vacuum pump having a housing C.

Figure 2A:
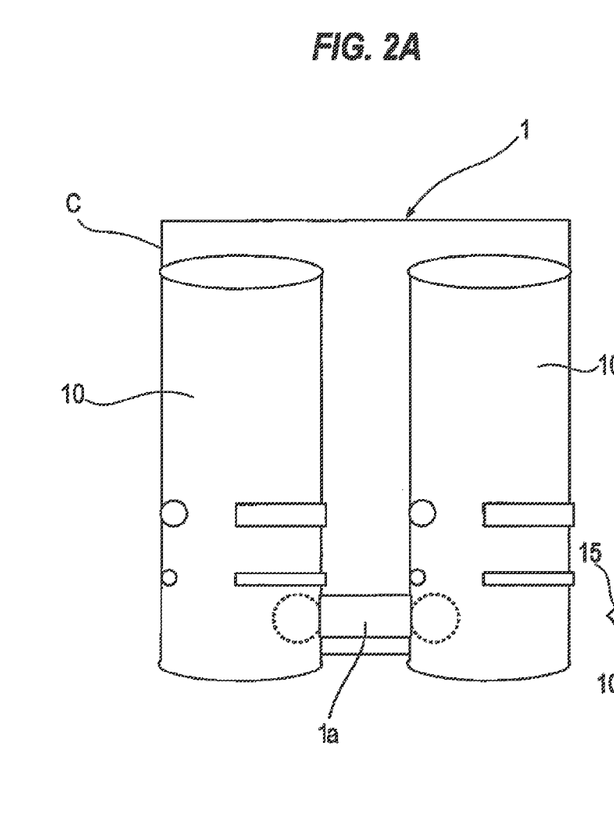
FIG. 2A is a schematic front elevational view showing another configuration example of a vacuum pump with abatement function according to the embodiment of the present invention.
Figure 2B:
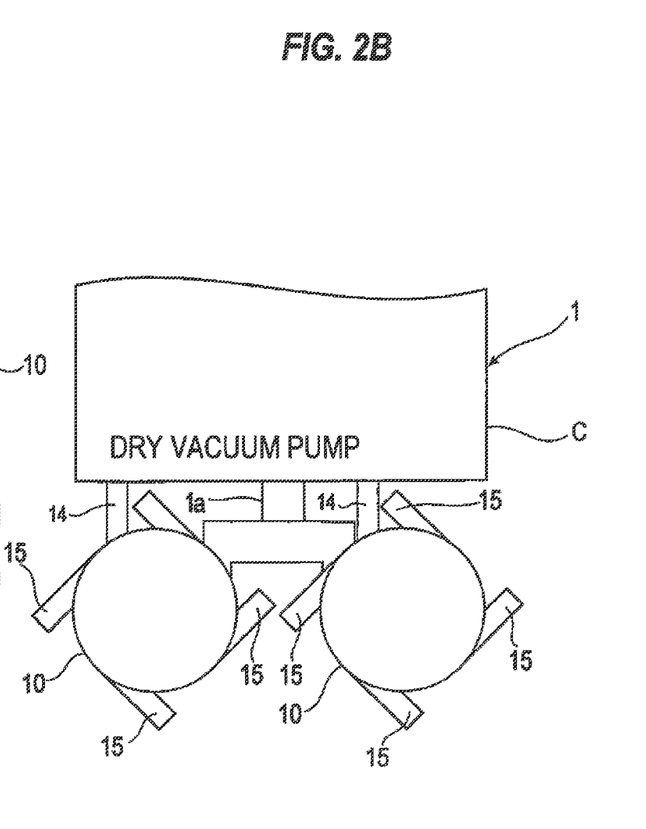
FIG. 2B is a schematic plan view of the vacuum pump shown in FIG. 2A.

FIGS. 2A and 2B are views showing another configuration example of a vacuum pump with abatement function according to the present invention. FIG. 2A is a schematic front view of the vacuum pump with abatement function, and FIG. 2B is a schematic plan view of the vacuum pump with abatement function. As shown in FIGS. 2A and 2B, a vacuum pump with abatement function according to the present invention has a configuration wherein two abatement parts 10, 10 are attached to respective portions branched from the discharge pipe 1a of the vacuum pump 1.

In FIGS. 1A and 1B and FIGS. 2A and 2B, the discharge pipe 1a which connects a discharge port of the vacuum pump 1 and a gas introduction port of the abatement part 10 has a piping length of not more than 500 mm, specifically 200 mm to 400 mm.

Figure 3:
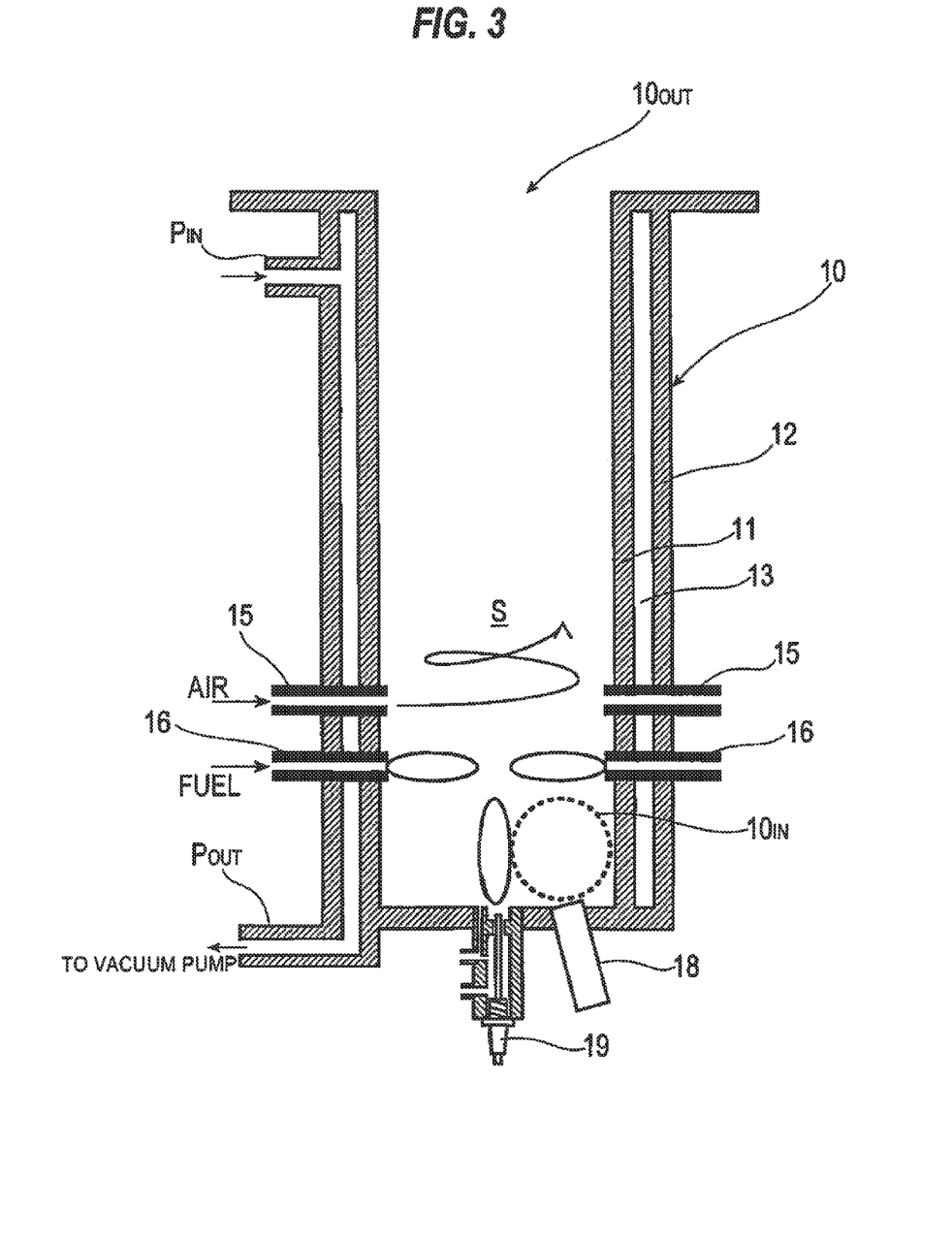
FIG. 3 is a cross-sectional view showing a configuration of an abatement part of the vacuum pump with abatement function.

FIG. 3 is a schematic cross-sectional view showing a configuration of the abatement part 10 of the vacuum pump with abatement function. As shown in FIG. 3, the abatement part 10 is composed of a cylindrical container as a whole.

The cylindrical container-shaped abatement part 10 is disposed in a vertical direction so that its central axis extends in a vertical direction. The abatement part 10 comprises a cylindrical member 11 which has a bottom and forms a combustion chamber S therein for forming flames by a burner and combusting an exhaust gas, and an outer cylinder 12 provided so as to surround the cylindrical member 11 with a predetermined distance therebetween. A heating chamber 13 for holding and heating an in gas such as an $N_2$ gas is formed between the cylindrical member 11 and the outer cylinder 12. The inert gas such as an $N_2$ gas flows into the heating chamber 13 from an inlet port $P_{IN}$ provided at an upper part of the outer cylinder 12 and flows out from an outlet port $P_{OUT}$ provided at a lower part of the outer cylinder 12. The heating chamber 13 having a double-pipe-structure constitutes a heat exchanger. The inert gas heated in the heating chamber 13 can be supplied to the vacuum pump 1. As shown in FIGS. 1A and 1B and FIGS. 2A and 2B, the abatement part (or abatement parts) 10 and the vacuum pump 1 are connected by a pipe (or pipes) 14, and an inert gas such as an $N_2$ gas heated in the heating chamber 13 can be supplied to the vacuum pump 1 by the pipe 14. The inert gas is heated in the heating chamber 13 to a temperature which is substantially equal to an internal temperature of the vacuum pump 1, for example, to a temperature of 190° C. to 220° C.

As shown in FIG. 3, a gas introduction port $10_{IN}$ for introducing the exhaust gas to be treated into the combustion chamber is formed at a lower part of a circumferential wall of the abatement part 10. A gas outlet $10_{OUT}$ for discharging the gases after treatment is formed at the upper end of the abatement part 10. A plurality of air no vies 15 for supplying air into the combustion chamber S and a plurality of fuel nozzles 16 for supplying a fuel into the combustion chamber S are provided in the abatement part 10. As shown in FIGS. 1 and 2, the air nozzles 15 extend at a predetermined angle to the tangential direction of the abatement part 10 to blow off air so as to form swirling flows along an inner circumferential surface of the circumferential wall of the cylindrical member 11. Similarly, the fuel nozzles 16 extend at a predetermined angle to the tangential direction of the cylindrical member 11 to blow off the fuel so as to form swirling flows along the inner circumferential surface of the circumferential wall of the cylindrical member 11. The air nozzles 15 and the fuel nozzles 16 are disposed respectively at predetermined intervals in the circumferential direction of the cylindrical member 11. A UV sensor 18 for detecting flames and a plug 19 for ignition are provided on the bottom of the cylindrical member 11.

Figure 4:
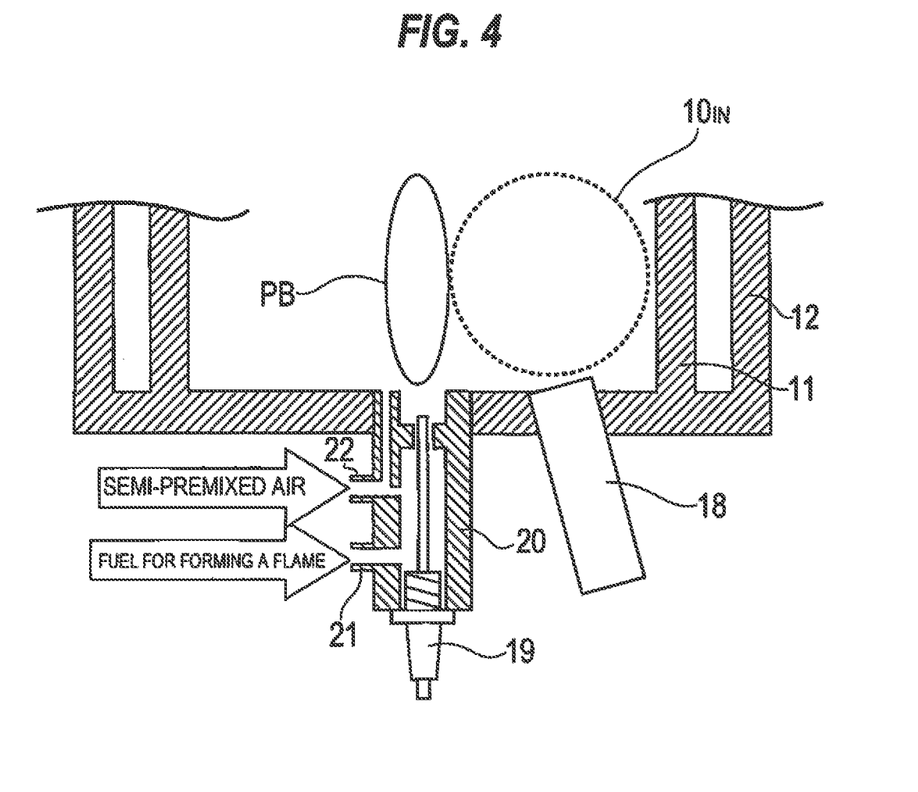
FIG. 4 is an enlarged cross-sectional view showing essential parts of FIG. 3.

FIG. 4 is an enlarged view of FIG. 3. As shown in FIG. 4, the plug 19 is provided on the bottom of the cylindrical member 11, and a cylindrical pilot burner part 20 is provided so as to surround the plug 19. A fuel supply port 21 for supplying a fuel for forming a flame and an air supply port 22 for supplying semi-premixed air are formed in the pilot burner part 20. Thus, a pilot burner flame PB is formed by igniting the fuel supplied from the fuel supply port 21 with the plug 19.

Next, operation of the abatement part 10 shown in FIGS. 3 and 4 will described.

The fuel is blown of from the plural fuel nozzles 16 provided in the abatement part 10 toward the combustion chamber S so as to form the swirling flows. Further, air is blown of from the plural air nozzles 15 toward the combustion chamber S so as to form the swirling flows. Then, the mixture gas of fuel and air is ignited by the pilot burner PB, and thus the swirling flows of flames (swirling flames) are formed along the inner circumferential surface of the cylindrical member 11.

On the other hand, the exhaust gas to be treated is blown off toward the combustion chamber S from the exhaust gas introduction port $10_{IN}$ which opens on the inner circumferential surface of the cylindrical member 11. The blown-off exhaust gas mixes with the swirling flames of the mixture gas and is combusted. At this time, because the fuel is blown off from all the fuel nozzles 16 provided in the circumferential direction of the cylindrical member 11 so as to swirl intensely in one direction, combustion efficiency of the exhaust gas becomes high. Further, since the air ejected from the air nozzles 15 is also swirling, while the air flows mix with the flames to accelerate the swirling flows of the flames, the exhaust gas is oxidatively decomposed. The treated gas is discharged from the gas outlet $10_{OUT}$ at the upper end of the abatement part 10, and is then discharged to the exhaust duct.

According to the present invention, the exhaust gas discharged from the vacuum pump 1 has been heated by compression heat in the vacuum pump 1 to a temperature of about 200° C., and the heated exhaust gas is introduced from the discharge pipe 1a directly into the abatement part 10 wherein the exhaust gas is treated to be made harmless by combustion. Therefore, it is not necessary to warm the exhaust gas from normal temperature, and an amount of fuel used in the abatement part 10 can be reduced, thus achieving energy saving. Since the exhaust gas heated to a temperature of about 200° C. flows through the discharge pipe 1a of the vacuum pump 1, it is not necessary to heat the discharge pipe 1a by a heater for piping. Therefore, it is not necessary to install the heater for piping, and thus energy saving can be achieved. Further, since the discharge pipe in which connects the vacuum pump 1 and the abatement part 10 has a piping length of not more than 500 mm, and hence the product can be prevented from being attached to the discharge pipe 1a.

Further, according to the present invention, combustion waste heat generated by abatement treatment of the exhaust gas is utilized to heat the inert gas such as an $N_2$ in the heating chamber 13 of the abatement part 10, and the heated inert gas is supplied to the vacuum pump through the pipe 14. Therefore, purging of the vacuum pump 1 can be performed by the heated inert gas, and thus a product can be prevented from being attached to the interior of vacuum pump 1. According to the present invention, it is not necessary to install a dedicated heater for heating the inert gas, thus achieving energy saving. The inert gas may be a gas which does not react with the contained gases, other than $N_2$. For example, the inert gas may be a noble gas such as He, Ar or Kr, or $CO_2$.

In the embodiment shown in FIG. 3, the flow passage for allowing the inert gas to flow in the abatement part 10 is provided outside the combustion chamber s, but may be provided inside the combustion chamber S.

Further, in FIG. 3, the combustion-type abatement part 10 is exemplified. However, the abatement part 10 may be an electrothermal-type gas treatment part. A gas to be heated (inert gas) is allowed to flow on the inner side of the combustion-type or electrothermal-type abatement part 10. In the case where the flow passage for allowing the gas to he heated (inert gas) to flow on the inner side of the abatement part 10 is provided, the flow passage may have the same configuration as a single-tubular heat exchanger or multi-tubular heat exchanger. The flow passage of the gas to be heated may pass through the side wall of the gas treatment part and run through the treatment part.

In order to enhance heat-exchange efficiency of the heat exchanger, fins or fillers may be disposed on the outer side and/or the inner side of the flow passage. Further, heat exchange may be performed in a multiple-stage manner to increase the heat-exchange efficiency. Specifically, single-tubular or multi-tubular heat exchangers may be provided in a multiple-stage manner. From the standpoint of efficiency of the heat exchange, as shown in FIG. 3, it is desirable that the inert gas is introduced from the low-temperature part and the heated inert gas is taken out from the high-temperature part of the abatement part. However, the inert gas may be introduced from the high-temperature part and the heated inert gas may be taken out from the low-temperature part of the abatement part.

The flow direction of the exhaust gas (or combustion gas) and the flow direction of the gas to be heated (inert gas) may be perpendicular to each other or parallel to each other or opposed to each other.

The introduction position of the inert gas into the vacuum pump may be selected from anywhere as long as the introduction position is effective to prevent the product from being attached. In the case of a roots-type dry vacuum pump, the introduction of the inert gas into an intermediate stage of compression stages is effective to obtain temperature increase. Therefore, the introduction of the inert gas into the intermediate stage is desirable from the standpoint of energy saving. In a screw-type dry vacuum pump also, the inert gas should be introduced into the intermediate stage. However, if the introduction position is too close to the vacuum side, the evacuation performance is affected, and thus it is necessary to select a suitable introduction position. It is preferable that the temperature of the inert gas is substantially equal to the internal temperature of the vacuum pump. This temperature adjustment of the inert gas allows a change in dimension of the rotor and the casing to be minimized.

Figure 5A:
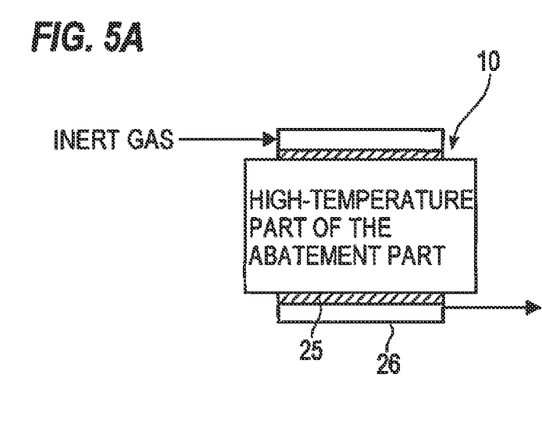
FIG. 5A is a schematic cross-sectional view showing a configuration example in which an inner wall of the abatement part is composed of a heat insulating material to prevent the heat exchanger disposed on the outer side of the abatement part from being heated more than necessary.
Figure 5B:
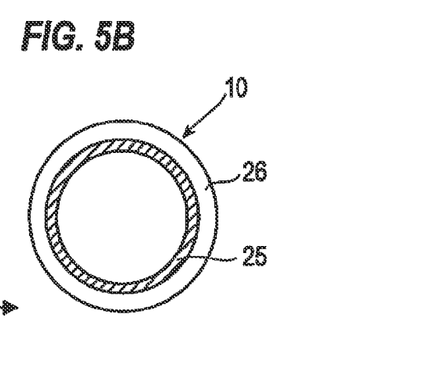
FIG. 5B is a side view of the configuration example shown in FIG. 5A.

FIGS. 5A and 5B are views showing a configuration example in which an inner wall of the abatement part 10 is composed of a heat insulating material to prevent the heat exchanger disposed on the outer side of the abatement part 10 from being heated more than necessary. FIG. 5A is a schematic cross-sectional view of the abatement 10, and FIG. 5B is a side view of the abatement part 10.

As shown in FIGS. 5A and 5B, the abatement part 10 has an inner wall composed of a heat insulating material 25 in a high-temperature part serving as a gas treatment portion. A cylindrical heat exchanger 26 is disposed at an outer circumferential side of the heat insulating material 25 to heat the inert gas. The heat exchanger 26 has the same structure as the beating chamber 13 shown in FIG. 3. By providing the heat insulating material 25, components of the heat exchanger 26 (for example, seal materials) are not heated more than necessary, and thus the components are not damaged. The inner wall of the abatement part 10 may comprise a wall containing a heat insulating material.

Figure 6A:
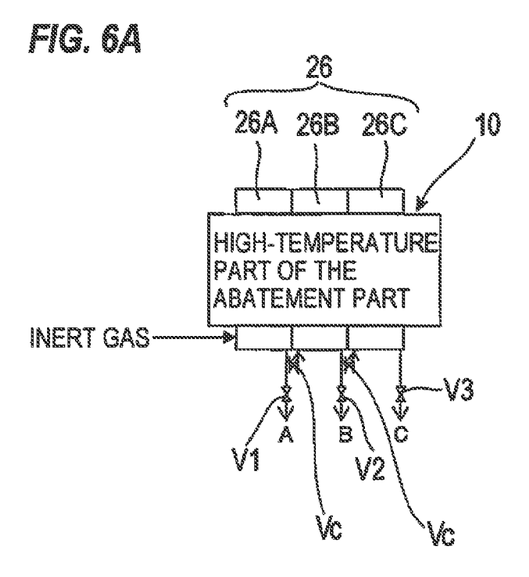
FIG. 6A is a schematic cross-sectional view showing a configuration example in which the heat exchanger is disposed on the outer side of the abatement part and divided into a plurality of segments in an axial direction of the abatement part.
Figure 6B:
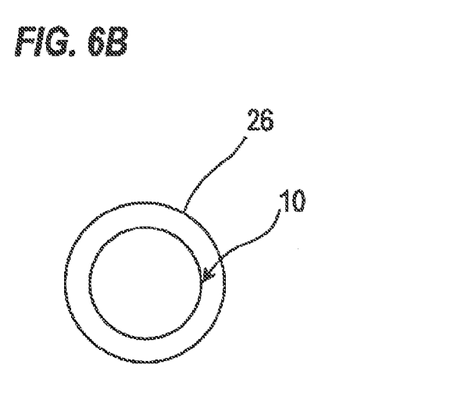
FIG. 6B is a side view of the the configuration example shown in FIG. 6A.

FIGS. 6A and 6B are views showing a configuration example in which the heat exchanger 26 is disposed on the outer side of the abatement part 10 and divided into a plurality of segments in an axial direction of the abatement part 10. FIG. 6A is a schematic cross-sectional view of the heat exchanger 26 and FIG. 6B is a side view of the heat exchanger 26.

As shown in FIGS. 6A and 6B, the heat exchanger 26 is divided into three chambers, i.e., a first heat exchanger part 26A, a second heat exchanger part 26B and a third heat exchanger part 26C. Valves V1, V2, V3 are provided in the respective heat exchanger parts 26A, 26B, 26C, and connecting valves Vc, Vc are provided between the adjacent chambers. By opening and closing the respective valves V1, V2, V3 and Vc, Vc suitably, the number of chambers to be used are changed to control the temperature of the gas to be heated (inert gas). Specifically, when a low-temperature gas is sufficient, the heated gas (inert gas) is supplied from the outlet A to the vacuum pump 1. When a high-temperature gas is required, the heated gas (inert gas) is supplied from the outlet It to the vacuum pump 1. When a higher-temperature gas is required, the heated gas (inert gas) is supplied from the outlet C to the vacuum pump 1. When the heat exchanger 26 is divided, the chamber of the heat exchanger may be divided in a vertical direction or a lateral direction or an oblique direction.

As shown in FIGS. 6A and 6B, by changing the number of the chambers in the heat exchanger 26, even if the temperature of the abatement part 10 is changed, the gas having a constant temperature can be supplied to the vacuum pump 1.

Further, the configuration shown in FIGS. 6A and 6B can cope with the case where the optimum temperature of the pump is changed. For example, at the time of forming a film in an SiN process, it is necessary to keep the pump warm to a temperature of 180° C. or higher, thereby preventing $NH_4Cl$ from being attached to the pump. In the case of performing $ClF_3$ cleaning, it is necessary to lower the temperature of the pump. In these cases also, by changing the number of chambers in the heat exchanger 26 suitably, the inert gas having a desired temperature can be supplied to the pump.

Further, it is necessary to increase or decrease the purging amount of the gas in the vacuum pump 1. By changing the number of the chambers to be used, the increase or decrease of the purging amount of the gas can be performed by increasing or decreasing the amount of the gas while the heated gas (inert gas) is maintained at a desired temperature.

Figure 7:
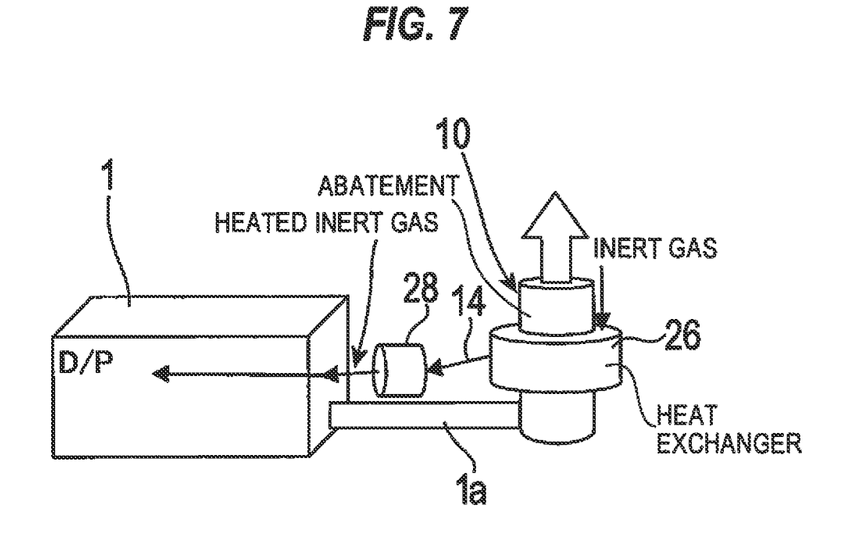
FIG. 7 is a schematic perspective view showing a configuration example in which the inert gas heated by the heat exchanger installed in the abatement part is further heated by a heater.

FIG. 7 is a schematic perspective view showing a configuration example in which the inert gas heated by the heat exchanger 26 installed in the abatement part 10 is further heated by a heater. As shown FIG. 7, a heater 28 is provided in the middle of the pipe 14 which connects the heat exchanger 26 installed in the abatement part 10 and the vacuum pump 1. The inert gas heated by the heat exchanger 26 which utilizes waste heat of the abatement part 10 is further heated by the heater 28. Thus, the temperature of the inert gas can be equal to the internal temperature of the vacuum pump 1, and a change in dimension of the rotor and the casing can be minimized.

Figure 8:
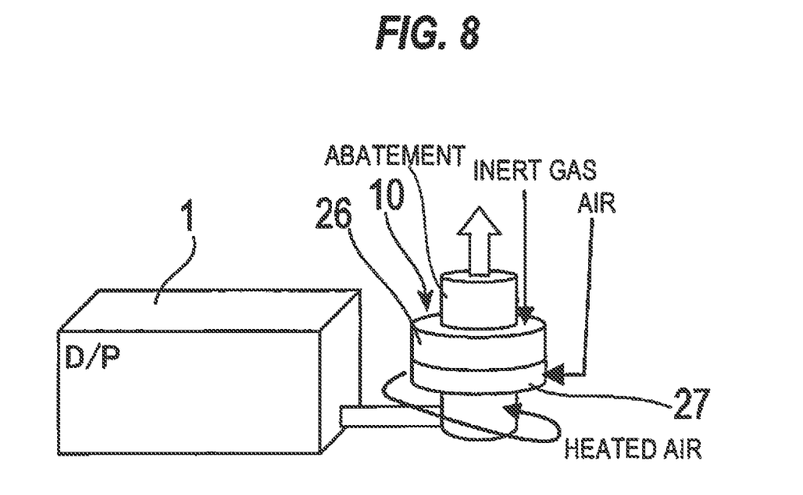
FIG. 8 is a schematic perspective view showing a configuration example in which a heat exchange mechanism for preheating air for oxidization is provided in the abatement part.

FIG. 8 is a schematic perspective view showing a configuration example in which a heat exchange mechanism for preheating air for oxidization is provided in the abatement part 10. As shown in FIG. 8, a heat exchange mechanism 27 is provided immediately below the heat exchanger 26 to preheat air for oxidization. Thus, the air for oxidization supplied to the abatement part 10 can be preheated by the heat exchange mechanism 27. The preheated air is supplied to the air nozzles 15 of the combustion-type abatement part 10 (see FIG. 3). In the combustion-type abatement part 10 shown in FIG. 3, in some cases, it is necessary to preheat the air for oxidization to obtain pyrolysis temperature required in the abatement part 10. As shown in FIG. 8, by heating the air for oxidization using waste heat of the abatement part 10, a heater required for preheating can be eliminated, thus promoting energy saving.

Figure 9:
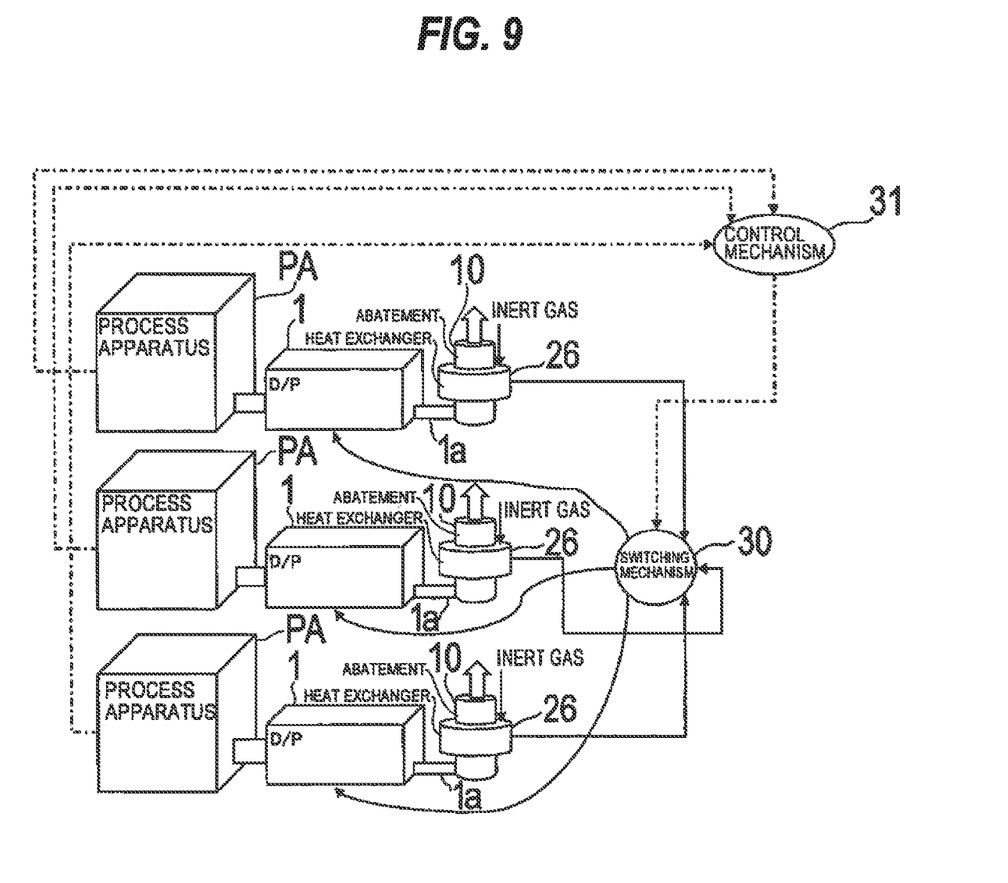
FIG. 9 is a schematic perspective view showing a system which comprises a plurality of vacuum pumps connected to a plurality of process apparatuses, and a plurality of abatement parts attached to the respective vacuum pumps, and distributes the inert gas heated by the abatement part to the plurality of vacuum pumps.

FIG. 9 is a schematic perspective view showing a system which comprises a plurality of vacuum pumps 1 connected to a plurality of process apparatuses, and a plurality of abatement parts 10 attached to the respective vacuum pumps 1. This system is configured to distribute the inert gas heated by the abatement part 10 to the plural vacuum pumps 1.

As shown in FIG. 9, the system has a plurality of process apparatuses PA which are connected respectively to the vacuum pumps 1. The abatements parts 10 are attached to the respective discharge pipes 1a of the vacuum pumps 1. The heat exchangers 26 are provided in the respective abatement parts 10, and outlet pipes of the respective heat exchangers 26 are connected to a switching mechanism 30. The respective process apparatuses PA and the switching mechanism 30 are connected to a control mechanism 31. According to the system configured as shown in FIG. 9, purging routes of the inert gas can be switched depending on operational situation of the process. For example, in the case where an increase of internal temperature of the vacuum pump 1 is required to allow the vacuum pump 1 immediately after its start to become operational, the heated inert gas discharged front the pair of the vacuum pump and the abatement part which have been already operated is supplied to another vacuum pump 1 immediately after the start. Thus, the internal temperature of the vacuum pump 1 immediately after the start can be increased.

Next, safety measures in the apparatus and the system shown in FIGS. 1 through 9 will be described. In the case where the abatement part 10 attached to the vacuum pump 1 comprises a combustion-type abatement part, measures to prevent a flame from being extinguished can be taken. Specifically, as shown in FIG. 3, the combustion-type abatement part 10 has the UV sensor 18. When signal intensity of the UV sensor 18 becomes lower than a reference value, discharge ignition is performed by the plug 19. Thus, a flame can be prevented from being extinguished in the combustion chamber S.

Further, during operation of the process apparatus, when the vacuum pump is suddenly stopped due to its breakdown or the like, a countercurrent or backfire from the abatement past 10 to the process apparatus PA (see FIG. 9) occurs occasionally. Therefore, according to the present invention, if there is a possibility of sudden stop of the vacuum pump 1, a valve for supplying the inert gas is opened in conjunction with the detection of stop of the vacuum pump 1 to perform the inert gas purging of the abatement part and the vacuum pump, thereby preventing the countercurrent and the backfire to the process apparatus PA from occurring.

As a method for detecting the possibility of stop of the vacuum pump, the rotational speed of the vacuum pump 1 is detected by a change in voltage and/or current of the motor, and if the rotational speed of the vacuum pump 1 is lower than a reference value, it is judged that there is a possibility of stop of the vacuum pump 1. Then, the inert gas purging of the vacuum pump 1 and the abatement part 10 is performed. Further, simultaneously with the above operation, a signal for closing a gate valve provided between the vacuum chamber and the vacuum pump is outputted to close the gate valve.

In the apparatus and the system shown in FIGS. 1 through 9, because the exhaust gas heated by compression heat of the vacuum pump 1 flows through the discharge pipe 1a which connects the vacuum pump 1 and the abatement part 10, it is preferable to supply the exhaust gas to the abatement part 10 while the exhaust gas retains a high temperature. Therefore, according to the present invention, heat-retention measures are applied to the discharge pipe 1a which connects the vacuum pump 1 and the abatement part 10.

Figure 10A:
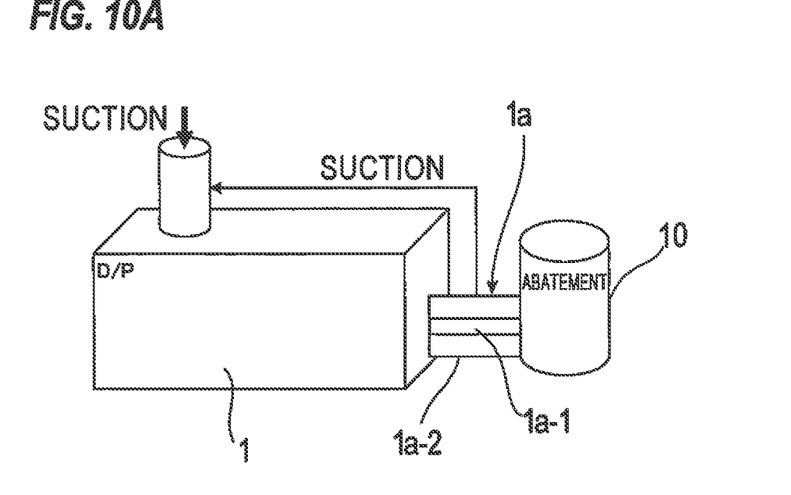
FIG. 10A is a schematic partial cross-sectional view showing a configuration example in which as hem-retention measures of the discharge pipe which connects the vacuum pump and the abatement part, the discharge pipe comprises a double pipe for vacuum insulation.
Figure 10B:
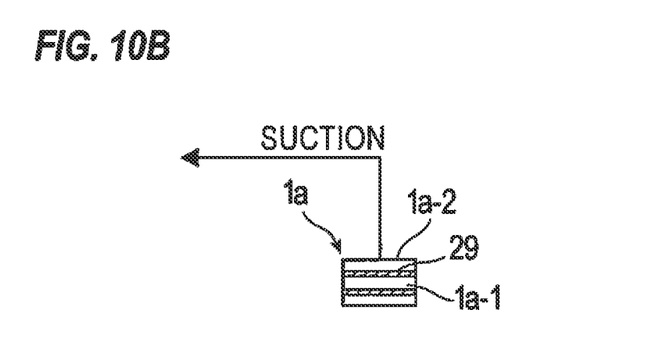
FIG. 10B is a view showing a modified example of FIG. 10A.

FIG. 10A is a schematic partial cross-sectional view showing a configuration example in which as heat-retention measures of the discharge pipe 1a which connects the vacuum pump 1 and the abatement part 10, the discharge pipe 1a comprises a double pipe for performing vacuum insulation. FIG. 10B is a view showing a modified example of FIG. 10A.

As shown in FIG. 10A, the discharge pipe 1a comprises a double pipe, and an inner pipe 1a-1 of the double pipe serves as a pipe for the exhaust gas between the vacuum pump and the abatement part and an interior of an outer pipe 1a-2 serves as a vacuum jacket. Then, the outer pipe 1a-2 is connected to the inlet of the vacuum pump 1 to evacuate the vacuum jacket wound the inner pipe 1a-1, thereby performing vacuum insulation. By the vacuum insulation, the discharge pipe 1a can be kept warm.

As the vacuum jacket is used, annually, the degree of vacuum is lowered to lower heat insulation performance. Therefore, it is necessary to perform vacuum evacuation of the vacuum jacket periodically. As shovn in FIG. 10A, by connecting the vacuum jacket to the inlet of the vacuum pump 1, the vacuum jacket can be evacuated at all times. Thus, it is not necessary to perform periodic vacuum evacuation. Further, since vacuum evacuation is performed at all times, a high degree of vacuum can, be maintained to enhance the heat insulation performance.

FIG. 10B shows a configuration example in which a heater 29 is provided around the inner pipe 1a-1 shown in FIG. 10A. By providing the heater 29 in addition to the vacuum jacket, heat-retention performance of the discharge pipe 1a can be further enhanced.

As a modified example of FIG. 10A, the discharge pipe 1a which connects the discharge port of the vacuum pump 1 and the abatement part 10 may comprise a double pipe. An inner pipe 1a-1 of the double pipe may serve as a pipe for the exhaust gas between the vacuum pump and the abatement part, and a space between the inner pipe 1a-1 and the outer pipe 1a-2 may serve as a flow passage of the inert gas heated by the above heat exchange mechanism to introduce the inert gas into the vacuum pump 1.

Further, the discharge pipe 1a which connect the discharge port of the vacuum pump 1 and the abatement part 10 may comprise a triple pipe. An innermost pipe of the triple pipe may serve as a pipe for the exhaust gas between the vacuum pump and the abatement part, and an outer space of the innermost pipe may serve as a flow passage of the inert gas heated by the above heat exchange mechanism to introduce the inert gas into the vacuum pump 1, and then an outermost space between the pipes may be evacuated by the vacuum pump. With this arrangement, the outermost space of the triple pipe may serve as a vacuum jacket, and this vacuum jacket may be evacuated to perform vacuum insulation. Therefore, the inert gas and the exhaust gas which flow inside the vacuum insulation can be kept warm.

Although the preferred embodiments of the present invention have been described above, it should be understood that the present invention is not limited to the above embodiments, but various changes and modifications may be made to the embodiments without departing from the scope of the appended claims.

What is claimed is:

1. An apparatus for abating exhaust gas, comprising:
   a vacuum pump having a discharge port;
   an abatement chamber coupled to the discharge port for treating an exhaust gas discharged from the vacuum pump to make the exhaust gas harmless is attached; and
   a heat exchanger configured to heat an inert gas by using heat generated when the exhaust gas is treated to be made harmless in the abatement part:
   wherein the heat exchanger comprises a plurality of heat exchange stages, and a switch controlling a number of stages of the plurality of heat exchange stages by which the inert gas is heated to control a temperature of the inert gas; and
   wherein the inert gas heated by the heat exchanger is introduced into the vacuum pump.

2. The apparatus for abating exhaust gas according to claim 1, wherein a heat insulating material is provided between the abatement chamber and the heat exchanger.

3. The apparatus for abating exhaust gas according to claim 1, wherein a heater for further heating the inert gas heated by the heat exchanger is provided, and the inert gas heated by the heater is introduced into the vacuum pump.

4. The apparatus for abating exhaust gas according to claim 1, wherein a pipe is coupled between the vacuum pump and the heat exchanger for introducing the inert gas from the heat exchanger to the vacuum pump comprises a double pipe, and an inner pipe of the double pipe serves as a passage for the inert gas and a space between the inner pipe and an outer pipe is evacuated by the vacuum pump.

5. The apparatus for abating exhaust gas according to claim 1, wherein a pipe connecting the discharge port of the vacuum pump and the abatement chamber comprises a double pipe, and an inner pipe of the double pipe serves as a passage for the exhaust gas and a space between the inner pipe and an outer pipe serves as a passage for the inert gas heated by the heat exchanger to introduce the inert gas into the vacuum pump.

6. The apparatus for abating exhaust gas according to claim 1, wherein a pipe connecting the discharge port of the vacuum pump and the abatement chamber comprises a triple pipe, and an innermost pipe of the triple pipe serves as a passage for the exhaust gas, an outer space around the innermost pipe serves as a passage for the inert gas heated by the heat exchanger to introduce the inert gas to the vacuum pump, and an outermost space between the pipes is evacuated by the vacuum pump.

7. A vacuum pump apparatus comprising:
a plurality of apparatuses for abating exhaust gas according to claim 1; and
a switching mechanism configured to distribute the inert gas heated by one of the abatement chambers of one of the plurality of apparatuses for abating exhaust gas to any of the vacuum pumps of one of the plurality of apparatuses for abating exhaust gas.

* * * * *